US009299779B2

(12) United States Patent
Sakai

(10) Patent No.: US 9,299,779 B2
(45) Date of Patent: Mar. 29, 2016

(54) SEMICONDUCTOR SUBSTRATE AND METHOD OF FABRICATING THE SAME

(75) Inventor: Shiro Sakai, Tokushima (JP)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/114,124

(22) PCT Filed: Jul. 8, 2011

(86) PCT No.: PCT/KR2011/005019
§ 371 (c)(1),
(2), (4) Date: Oct. 25, 2013

(87) PCT Pub. No.: WO2012/148039
PCT Pub. Date: Nov. 1, 2012

(65) Prior Publication Data
US 2014/0042493 A1 Feb. 13, 2014

(30) Foreign Application Priority Data

Apr. 28, 2011 (JP) ................................. 2011-100321
Jun. 3, 2011 (KR) ......................... 10-2011-0053952

(51) Int. Cl.
| H01L 33/20 | (2010.01) |
| H01L 29/06 | (2006.01) |
| H01L 33/22 | (2010.01) |
| H01L 21/02 | (2006.01) |
| H01L 33/00 | (2010.01) |

(52) U.S. Cl.
CPC ........ *H01L 29/0688* (2013.01); *H01L 21/0242* (2013.01); *H01L 21/0243* (2013.01); *H01L 21/0254* (2013.01); *H01L 21/02458* (2013.01); *H01L 21/02639* (2013.01); *H01L 21/02647* (2013.01); *H01L 21/02658* (2013.01); *H01L 21/02664* (2013.01); *H01L 33/007* (2013.01); *H01L 33/22* (2013.01); *H01L 33/0079* (2013.01); *H01L 33/20* (2013.01)

(58) Field of Classification Search
CPC ... H01L 33/007; H01L 21/0254; H01L 33/20; H01L 33/22; H01L 21/02458; H01L 21/02639; H01L 29/0688; H01L 33/0079; H01L 21/0242; H01L 21/0243; H01L 21/02647; H01L 21/02664; H01L 21/0658; C30B 29/406
See application file for complete search history.

(56) References Cited

U.S. PATENT DOCUMENTS

| 2003/0057444 | A1 | 3/2003 | Niki et al. |
| 2007/0026643 | A1 | 2/2007 | Tadatomo et al. |
| 2008/0251803 | A1 | 10/2008 | Cho et al. |
| 2010/0006862 | A1 | 1/2010 | Cheng |
| 2010/0012971 | A1* | 1/2010 | Hiraoka et al. ............... 257/103 |
| 2010/0102353 | A1* | 4/2010 | Park ............................. 257/98 |

FOREIGN PATENT DOCUMENTS

| JP | 2000-331937 | 11/2000 |
| JP | 2007-036240 | 2/2007 |
| JP | 2011-061219 | 3/2011 |
| JP | 2011-082547 | 4/2011 |
| KR | 10-2008-0088278 | 10/2008 |
| KR | 10-2008-0093222 | 10/2008 |
| KR | 10-2010-0042041 | 4/2010 |
| WO | 03/010831 | 2/2003 |

OTHER PUBLICATIONS

International Search Report issued on Apr. 19, 2012 in the International Application No. PCT/KR2011/005019.

* cited by examiner

*Primary Examiner* — Jiong-Ping Lu
(74) *Attorney, Agent, or Firm* — H.C. Park & Associates, PLC

(57) ABSTRACT

Disclosed are a flat and thin semiconductor substrate, which is formed on a heterogeneous substrate to be easily lifted-off from the heterogeneous substrate, a semiconductor device including the same, and a method of fabricating the same. The semiconductor substrate includes a substrate having a plurality of semispherical protrusions arranged at a predetermined interval on a first plane, and a first semiconductor layer formed on the first plane of the substrate.

15 Claims, 14 Drawing Sheets

Fig. 1
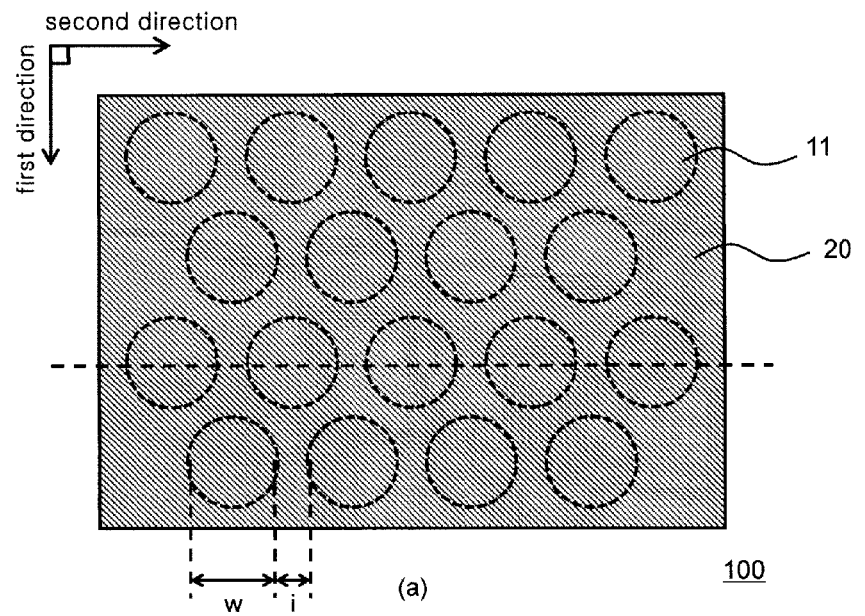
(a)
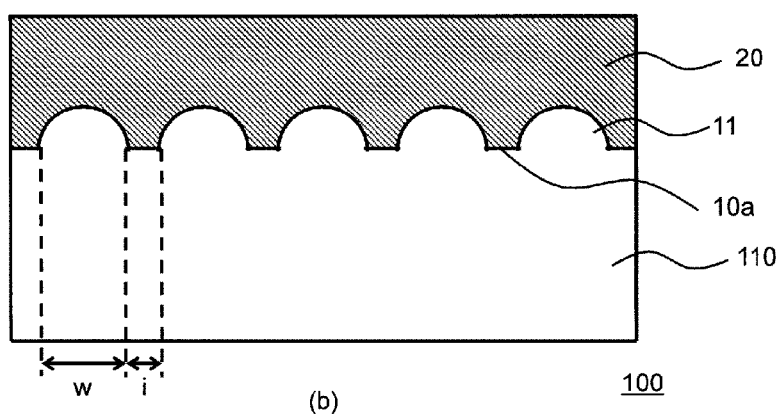
(b)
Fig. 2
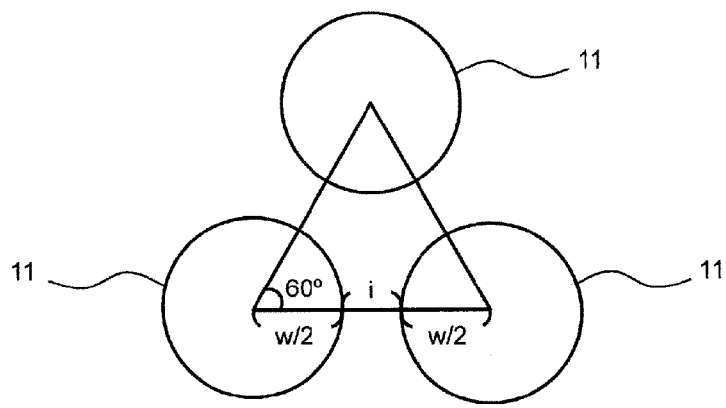

Fig. 3a
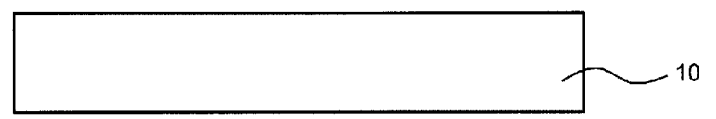
(a)
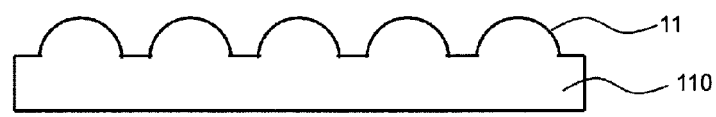
(b)
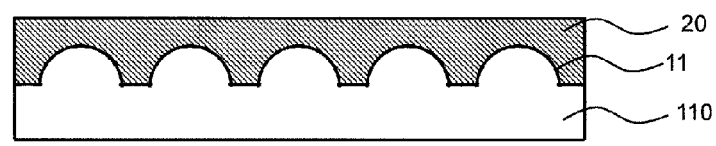
(c)
Fig. 3b
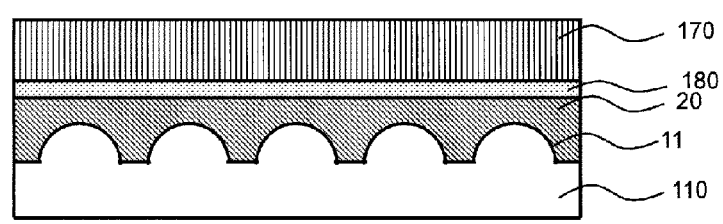
(d)
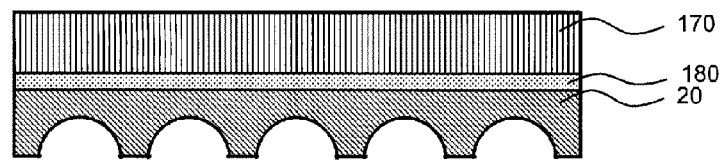
(e)
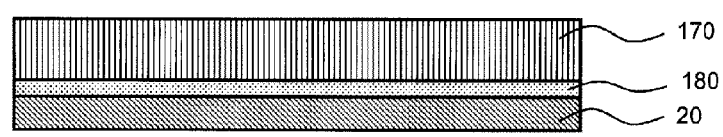
(f)

Fig. 4
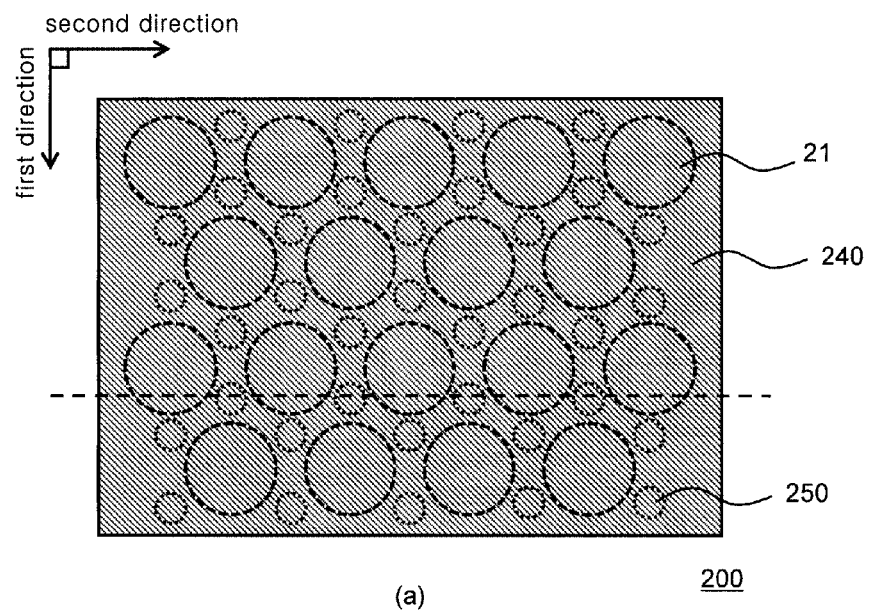
(a)
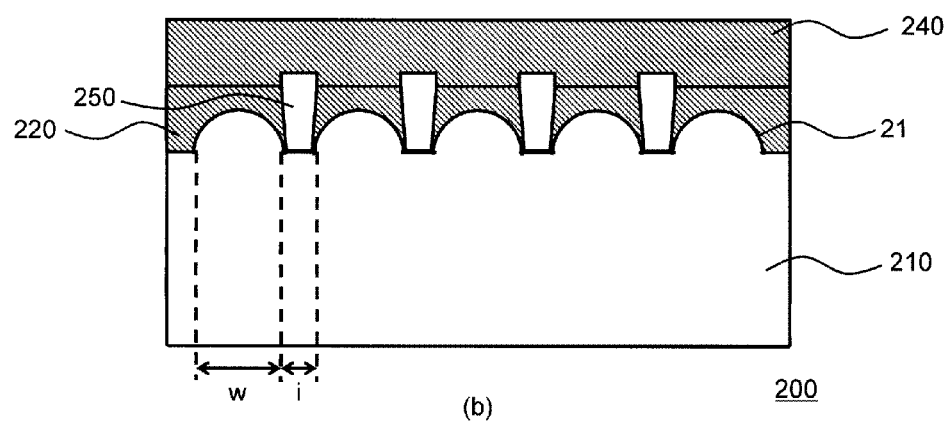
(b)

Fig. 5a
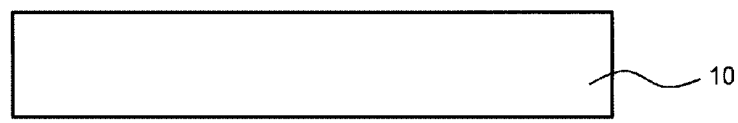
(a)
(b)
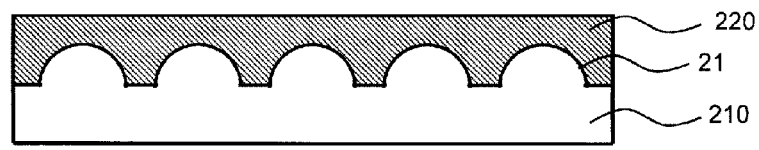
(c)
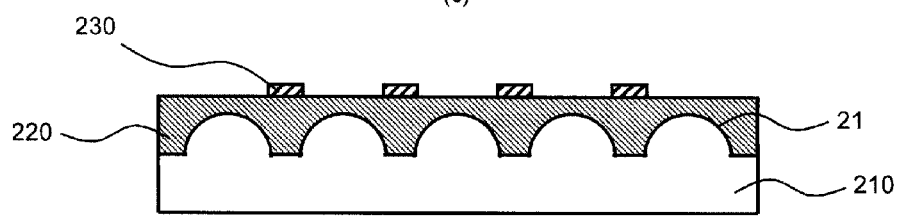
(d)
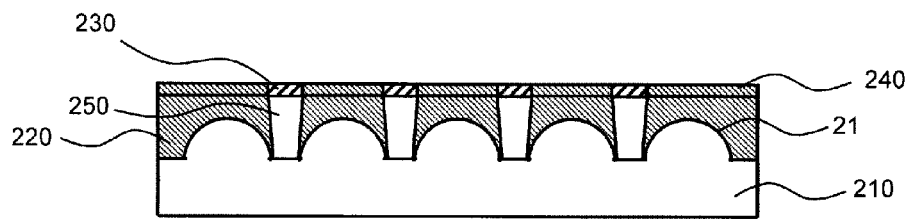
(e)

Fig. 5b
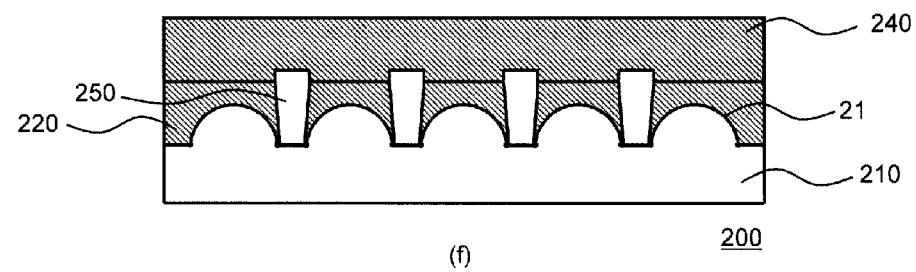
(f)
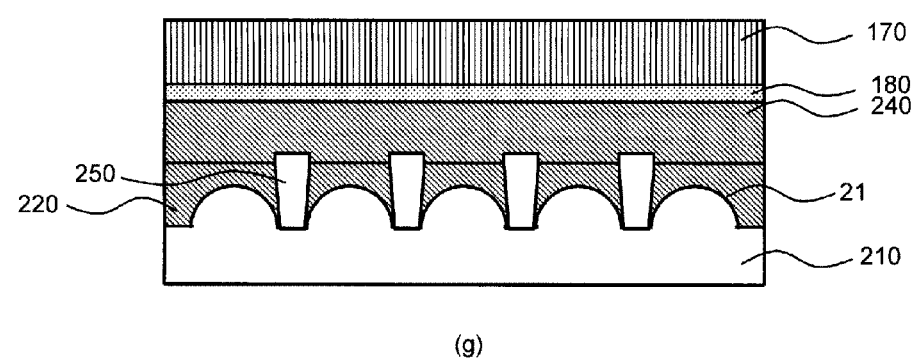
(g)
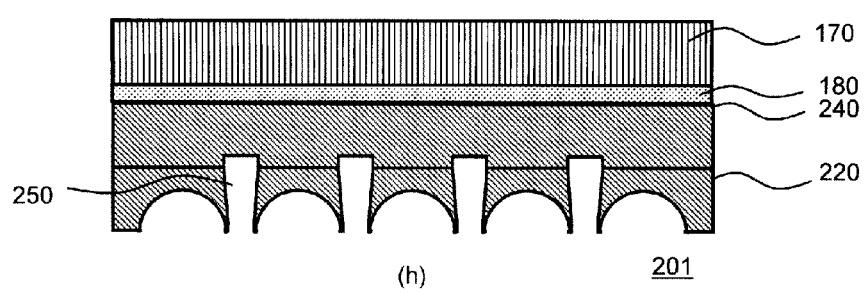
(h)
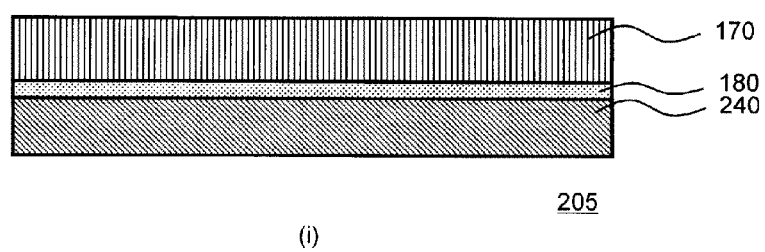
(i)

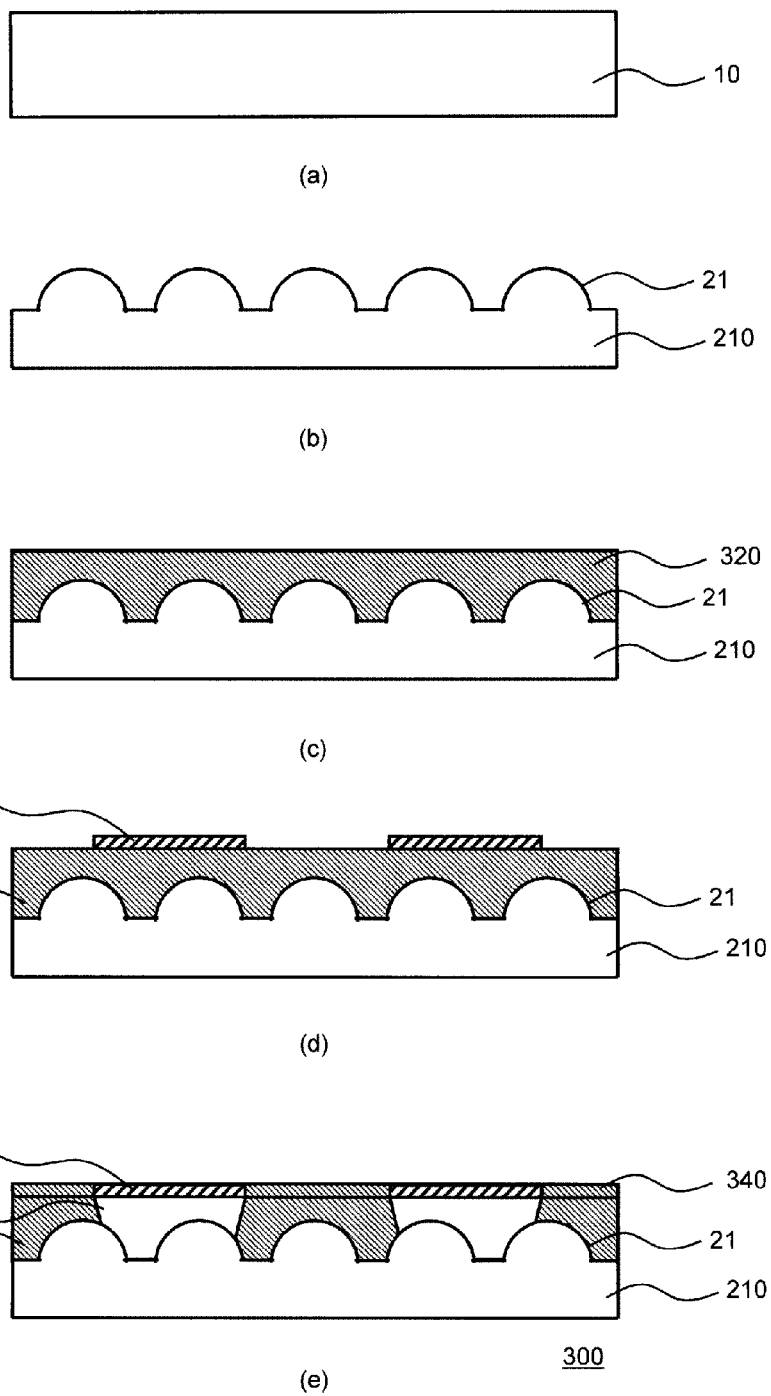

Fig. 7b
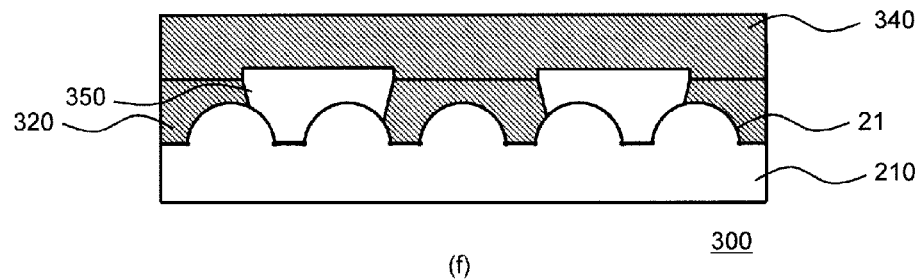
(f)
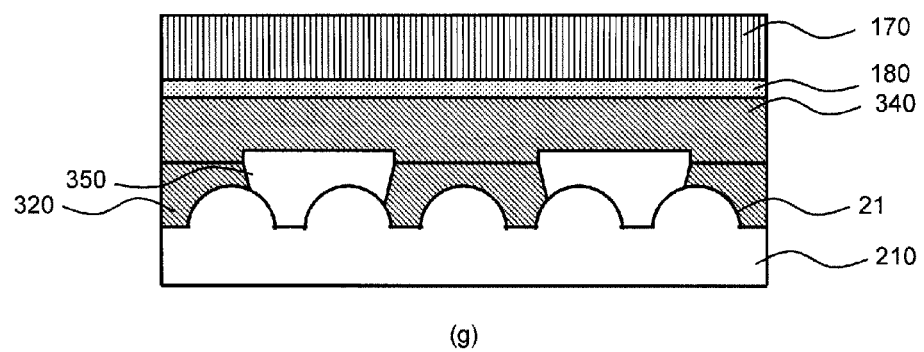
(g)
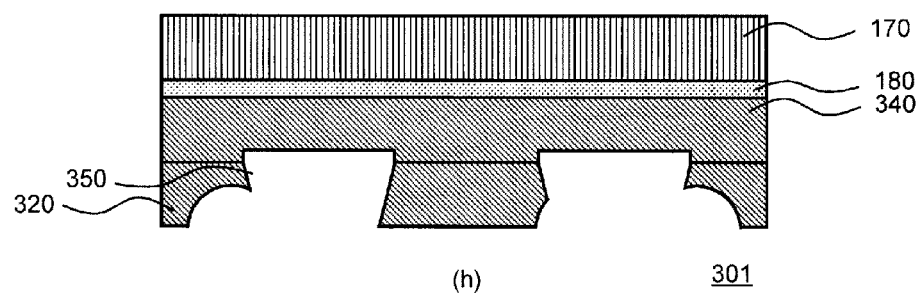
(h)
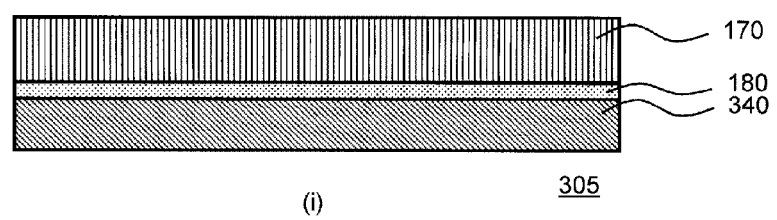
(i)

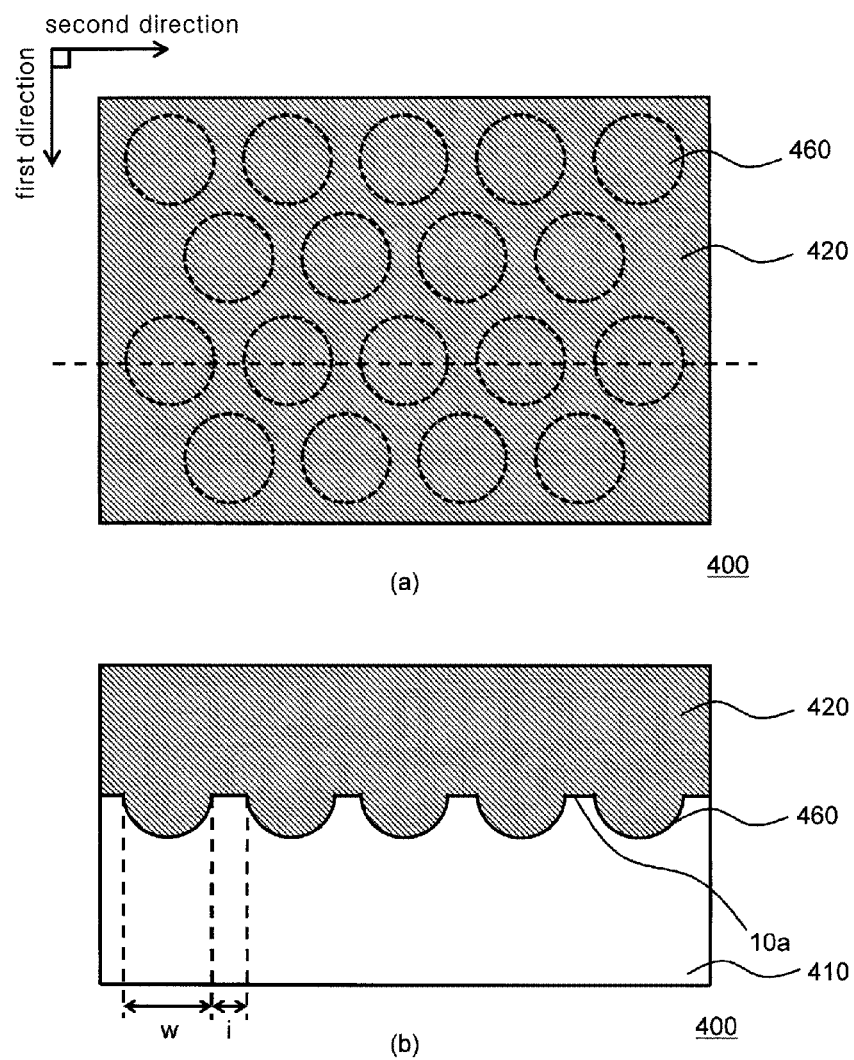

Fig. 9a
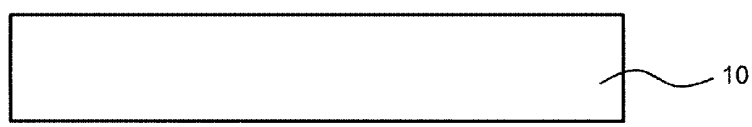
(a)
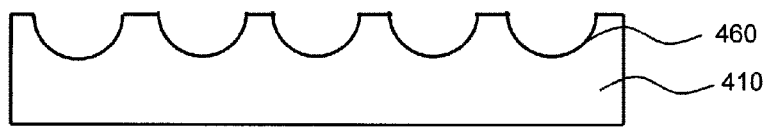
(b)
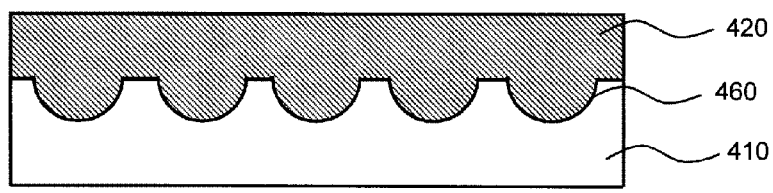
400
(c)

Fig. 9b
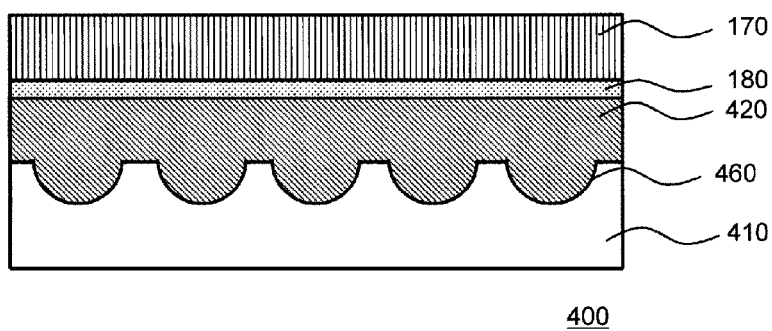
400
(d)
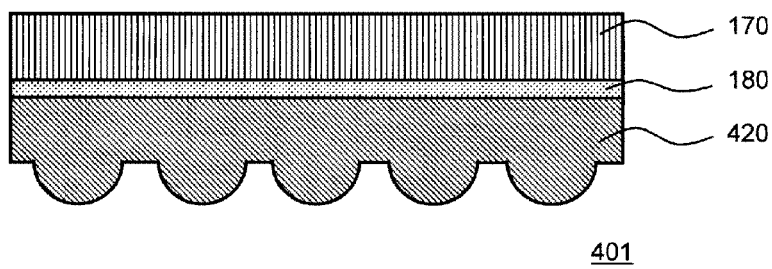
401
(e)
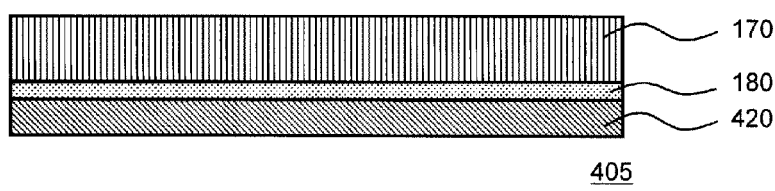
405
(f)

Fig. 10
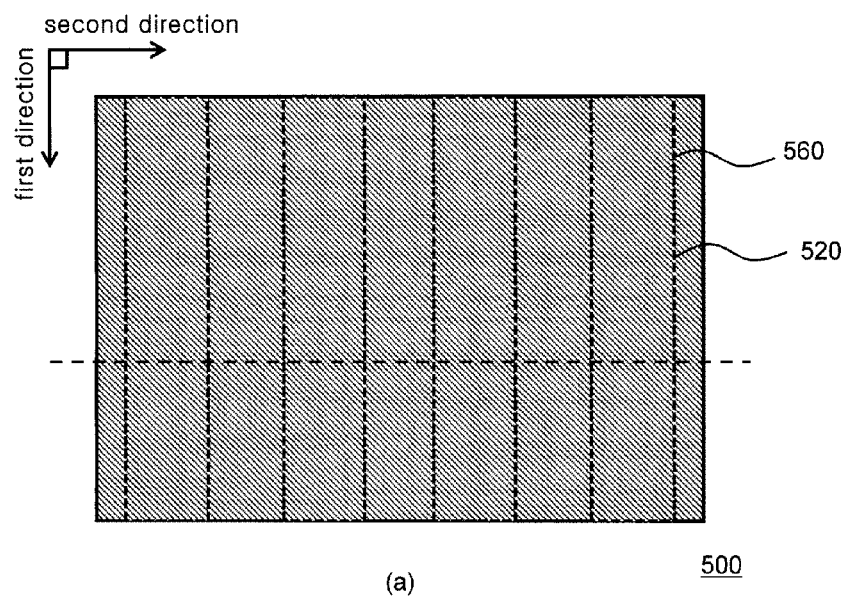
(a)
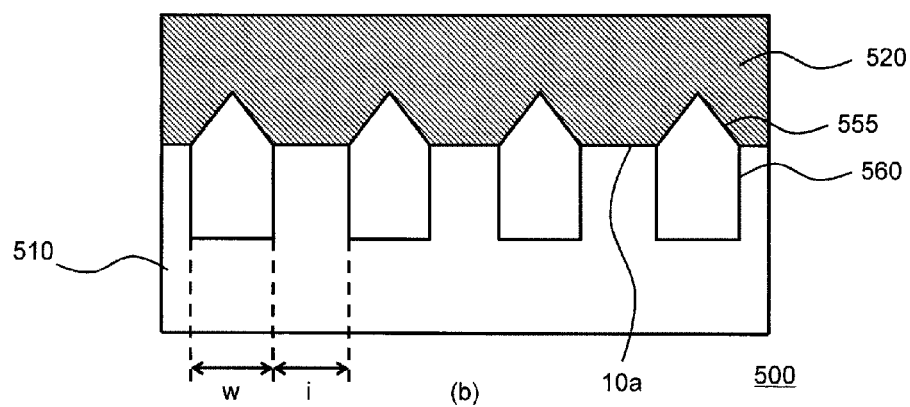
(b)

Fig. 11a
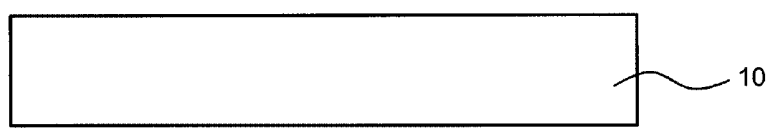
(a)
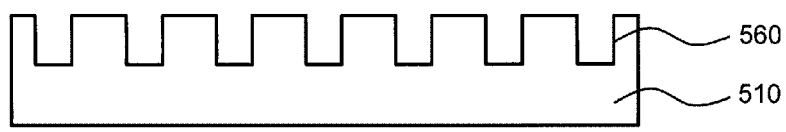
(b)
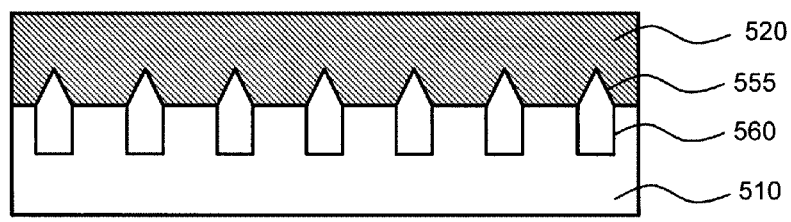
(c)

Fig. 11b
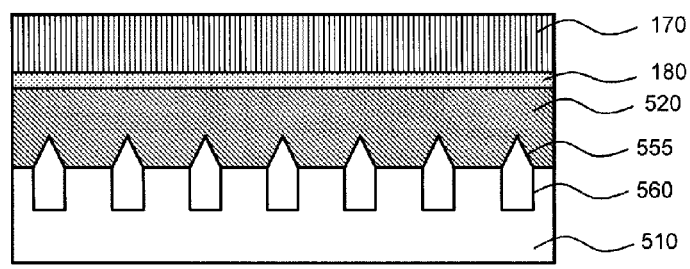
(d)
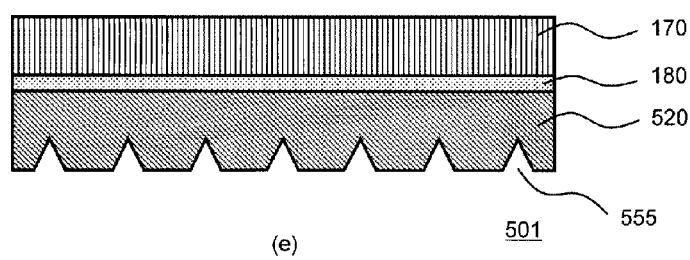
(e)
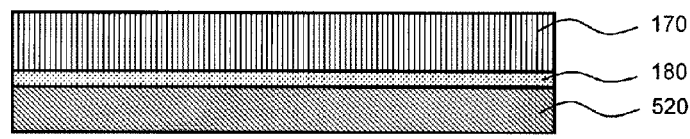
(f)
Fig. 12
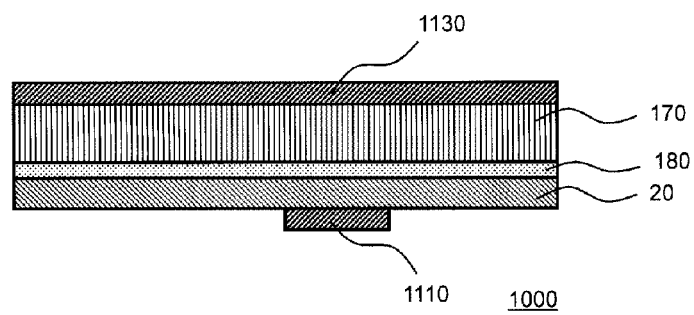
Fig. 13
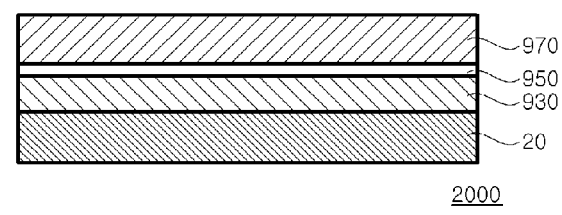

SEMICONDUCTOR SUBSTRATE AND METHOD OF FABRICATING THE SAME

CROSS-REFERENCE TO RELATED APPLICATIONS

This application is the National Stage entry of International Application PCT/KR2011/005019, filed on Jul. 8, 2011, and claims priority from and the benefit of Japanese Patent Application No. 2011-100321, filed on Apr. 28, 2011, and Korean Patent Application No. 10-2011-0053952, filed on Jun. 3, 2011, which are incorporated herein by reference for all purposes as if fully set forth herein.

BACKGROUND OF THE INVENTION

1. Field

The present invention relates to a semiconductor substrate, a semiconductor device, and a method of fabricating the same. More particularly, the present invention relates to a process of lifting-off a gallium nitride layer from a sapphire substrate, a semiconductor substrate and a semiconductor device fabricated through the lift-off process, and a method of fabricating the same.

2. Discussion of the Background

Gallium nitride (GaN) based light emitting diodes (LEDs) have been used in a wide range of applications including signals, a backlight unit of a liquid crystal panel, etc.

Since fabrication of a gallium nitride (GaN) substrate is very difficult and requires high manufacturing costs, semiconductor devices such as LEDs or laser diodes are generally fabricated by growing a GaN layer on a heterogeneous substrate such as sapphire. One example of crystal growth of GaN is disclosed in "Polycrystalline GaN for light emitter and field electron emitter applications" (S. Hasegawa, S. Nishida, T. Yamashita, H. Asahi, Thin Solid Films 487 (2005), pp. 260-267). In this document, a GaN crystal is grown on a quartz substrate, a high melting-point metal substrate of W, Mo, Ta and Nb, and a Si substrate through plasma-assisted molecular beam epitaxy.

However, lattice mismatch and different coefficients of thermal expansion between the GaN layer and the substrate cause high dislocation density or increases defects, obstructing improvement of luminous efficiency of an LED. Although mechanical polishing or laser ablation is performed to strip a GaN bulk crystal into a GaN substrate, it is very difficult to obtain a GaN substrate with practical size and good reproducibility. In addition, since a sapphire substrate has lower thermal conductivity than the GaN substrate, the sapphire substrate deteriorates heat dissipation of a semiconductor device. Further, when a thin GaN layer is formed on the sapphire substrate, it is very difficult to lift-off the GaN layer from the sapphire substrate.

SUMMARY

Exemplary embodiments of the invention provide a flat and thin semiconductor substrate, which is formed on a heterogeneous substrate to be easily lifted-off from the heterogeneous substrate, a semiconductor device including the same, and a method of fabricating the same.

In accordance with one exemplary embodiment of the invention, a semiconductor substrate includes a substrate having a plurality of semispherical protrusions arranged at a predetermined interval on a first plane, and a first semiconductor layer formed on the first plane of the substrate.

The ratio of the total surface area of the plurality of semispherical protrusions to the surface area of the first plane may be 1 or more.

The semispherical protrusions may have a bottom surface width of 5 um or less.

In the semiconductor substrate, the substrate may be a sapphire substrate and the first semiconductor layer may be a gallium nitride layer.

In the semiconductor layer, the semiconductor substrate may further include a second semiconductor layer formed on a second plane of the first semiconductor layer opposite the first plane, and cavities formed in a pattern of predetermined shapes at portions of the first semiconductor layer and the second semiconductor layer.

In the semiconductor substrate, the pattern of predetermined shapes may have a width of the predetermined interval, and the cavities may be located at positions on the second plane of the first semiconductor layer corresponding to intervals between the semispherical protrusions.

In the semiconductor substrate, the pattern of predetermined shapes may be composed of a plurality of rectangles each having a long side disposed in a first direction and arranged in a second direction orthogonal to the first direction to form the cavities.

In the semiconductor substrate, the first direction may be a {1-100} direction of the first semiconductor layer or an equivalent direction to the {1-100} direction.

In accordance with another exemplary embodiment of the invention, a semiconductor substrate includes: a substrate having a plurality of curved concavities arranged at a predetermined interval on a first plane of the substrate; and a first semiconductor layer formed on the first plane of the substrate.

In the semiconductor substrate, the curved concavities may have a bottom surface width of 5 um or less.

In the semiconductor substrate, the substrate may be a sapphire substrate and the first semiconductor layer may be a gallium nitride layer.

In accordance with a further exemplary embodiment of the invention, a method of fabricating a semiconductor substrate includes: forming a plurality of semispherical protrusions at a predetermined interval on a first plane of a substrate; and forming a first semiconductor layer on the first plane of the substrate.

In the method of fabricating a semiconductor substrate, the formation of the plurality of semispherical protrusions may be performed by etching the first plane of the substrate.

In the method of fabricating a semiconductor substrate, the semispherical protrusions may be formed on the first plane of the substrate such that the ratio of the total surface area of the plurality of semispherical protrusions to the surface area of the first plane may become 1 or more.

In the method of fabricating a semiconductor substrate, the semispherical protrusions may be formed on the first plane of the substrate such that the semispherical protrusions may have a bottom surface width of 5 um or less.

In the method of fabricating a semiconductor substrate, the first semiconductor layer may be formed by metal organic chemical vapor deposition.

In the method of fabricating a semiconductor substrate, the substrate may be a sapphire substrate and the first semiconductor layer may be a gallium nitride layer.

In the method of fabricating a semiconductor substrate, the method may further include lifting-off the first semiconductor layer from the substrate.

In the method of fabricating a semiconductor substrate, the method may further include forming metallic material layer having a pattern of predetermined shapes on a second plane of the first semiconductor layer opposite the first plane, and forming a second semiconductor layer on the second plane using metal organic chemical vapor deposition to form cavities at portions of the first semiconductor layer adjoining the metallic material layer.

In the method of fabricating a semiconductor substrate, the metallic material layer may be formed of tantalum, titanium or chromium.

In the method of fabricating a semiconductor substrate, the metallic material layer may be formed in the pattern of predetermined shapes having a width of the predetermined interval at positions on the second plane of the first semiconductor layer corresponding to intervals between the semispherical protrusions.

In the method of fabricating a semiconductor substrate, the pattern of predetermined shapes may be composed of a plurality of rectangles each having a long side disposed in a first direction and arranged in a second direction orthogonal to the first direction to form the metallic material layer.

In the method of fabricating a semiconductor substrate, the metallic material layer may be formed in the pattern of predetermined shapes such that the first direction becomes a {1-100} direction of the first semiconductor layer or an equivalent direction to the {1-100} direction.

In the method of fabricating a semiconductor substrate, the method may further include lifting-off the substrate using the cavities formed in the first semiconductor layer to fabricate a semiconductor substrate composed of the first semiconductor layer and the second semiconductor layer.

In accordance with still another exemplary embodiment of the invention, a method of fabricating a semiconductor substrate includes forming a plurality of curved concavities at a predetermined interval on a first plane of a substrate; and forming a first semiconductor layer on the first plane of the substrate.

In the method of fabricating a semiconductor substrate, the curved concavities may be formed on the first plane of the substrate such that the curved concavities has a bottom surface width of 5 um or less.

In the method of fabricating a semiconductor substrate, the substrate may be a sapphire substrate, and the first semiconductor layer may be a gallium nitride layer.

In the method of fabricating a semiconductor substrate, the method may further include lifting-off the first semiconductor layer from the substrate.

In the method of fabricating a semiconductor substrate, the first semiconductor layer may be lifted-off from the substrate using a laser lift-off process.

In the method of fabricating a semiconductor substrate, the first semiconductor layer may be lifted-off from the substrate using a mechanical lift-off process.

In accordance with still another exemplary embodiment of the invention, a semiconductor device includes: the first semiconductor layer lifted-off from one of the semiconductor substrates; a first compound semiconductor layer formed on the first semiconductor layer; an active layer formed on the first compound semiconductor layer; and a second compound semiconductor layer formed on the active layer.

In accordance with still another exemplary of the invention, a semiconductor device includes: a second semiconductor layer lifted-off from one of the semiconductor substrates; a first compound semiconductor layer formed on the second semiconductor layer; an active layer formed on the first compound semiconductor layer; and a second compound semiconductor layer formed on the active layer.

In accordance with still another exemplary embodiment of the invention, a method of fabricating a semiconductor device includes: lifting-off the substrate from the first semiconductor layer of one of the semiconductor substrates; forming a first compound semiconductor layer on the first semiconductor layer; forming an active layer on the first compound semiconductor layer; and forming a second compound semiconductor layer on the active layer.

In accordance with still another exemplary embodiment of the invention, a method of fabricating a semiconductor device includes: lifting-off the substrate from the second semiconductor layer of one of the semiconductor substrates; forming a first compound semiconductor layer on the second semiconductor layer; forming an active layer on the first compound semiconductor layer; and forming a second compound semiconductor layer on the active layer.

According to the exemplary embodiments, there are provided a flat and thin semiconductor substrate, which is formed on a heterogeneous substrate to be easily lifted-off from the heterogeneous substrate, a semiconductor device including the same, and a method of fabricating the same.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIG. 1 shows a semiconductor substrate 100 according to one exemplary embodiment of the present invention, in which FIG. 1(a) is a plan view of the semiconductor substrate 100 and FIG. 1(b) is a partially cross-sectional view taken along a dotted line of FIG. 1(a).

FIG. 2 is a diagram of a pattern of semispherical protrusions 11 according to the exemplary embodiment of the present invention.

FIG. 3A shows sectional views of a method of fabricating the semiconductor substrate 100 according to the exemplary embodiment of the present invention.

FIG. 3B shows sectional views of the method of fabricating the semiconductor substrate 100 according to the exemplary embodiment of the present invention.

FIG. 4 shows a semiconductor substrate 200 according to another exemplary embodiment of the present invention, in which FIG. 4(a) is a plan view of the semiconductor substrate 200 and FIG. 4(b) is a sectional view taken along a dotted line of FIG. 4(a).

FIG. 5A shows sectional views of a method of fabricating the semiconductor substrate 200 according to the exemplary embodiment of the present invention.

FIG. 5B shows sectional views of the method of fabricating the semiconductor substrate 200 according to the exemplary embodiment of the present invention.

FIG. 6 shows a semiconductor substrate 300 according to a further exemplary embodiment of the present invention, in which FIG. 6(a) is a plan view of the semiconductor substrate 300 and FIG. 6(b) is a sectional view taken along a dotted line of FIG. 6(a).

FIG. 7A shows sectional views of a method of fabricating the semiconductor substrate 300 according to the exemplary embodiment of the present invention.

FIG. 7B shows sectional views of the method of fabricating the semiconductor substrate 300 according to the exemplary embodiment of the present invention.

FIG. 8 shows a semiconductor substrate 400 according to still another exemplary embodiment of the present invention, in which FIG. 8(a) is a plan view of the semiconductor substrate 400 and FIG. 8(b) is a sectional view taken along a dotted line of FIG. 8(a).

FIG. 9A shows sectional views of a method of fabricating the semiconductor substrate 400 according to the exemplary embodiment of the present invention.

FIG. 9B shows sectional views of the method of fabricating the semiconductor substrate 400 according to the exemplary embodiment of the present invention.

FIG. 10 shows a semiconductor substrate 500 according to still another exemplary embodiment of the present invention, in which FIG. 10(a) is a plan view of the semiconductor substrate 500 and FIG. 10(b) is a sectional view taken along a dotted line of FIG. 10(a).

FIG. 11A shows sectional views of a method of fabricating the semiconductor substrate 500 according to the exemplary embodiment of the present invention.

FIG. 11B shows sectional views of the method of fabricating the semiconductor substrate 500 according to the exemplary embodiment of the present invention.

FIG. 12 is a partial sectional view of a semiconductor device 1000 according to one exemplary embodiment of the present invention.

FIG. 13 is a partial sectional view of a semiconductor device 2000 according to another exemplary embodiment of the present invention.

DETAILED DESCRIPTION OF THE ILLUSTRATED EMBODIMENTS

Figure 6:
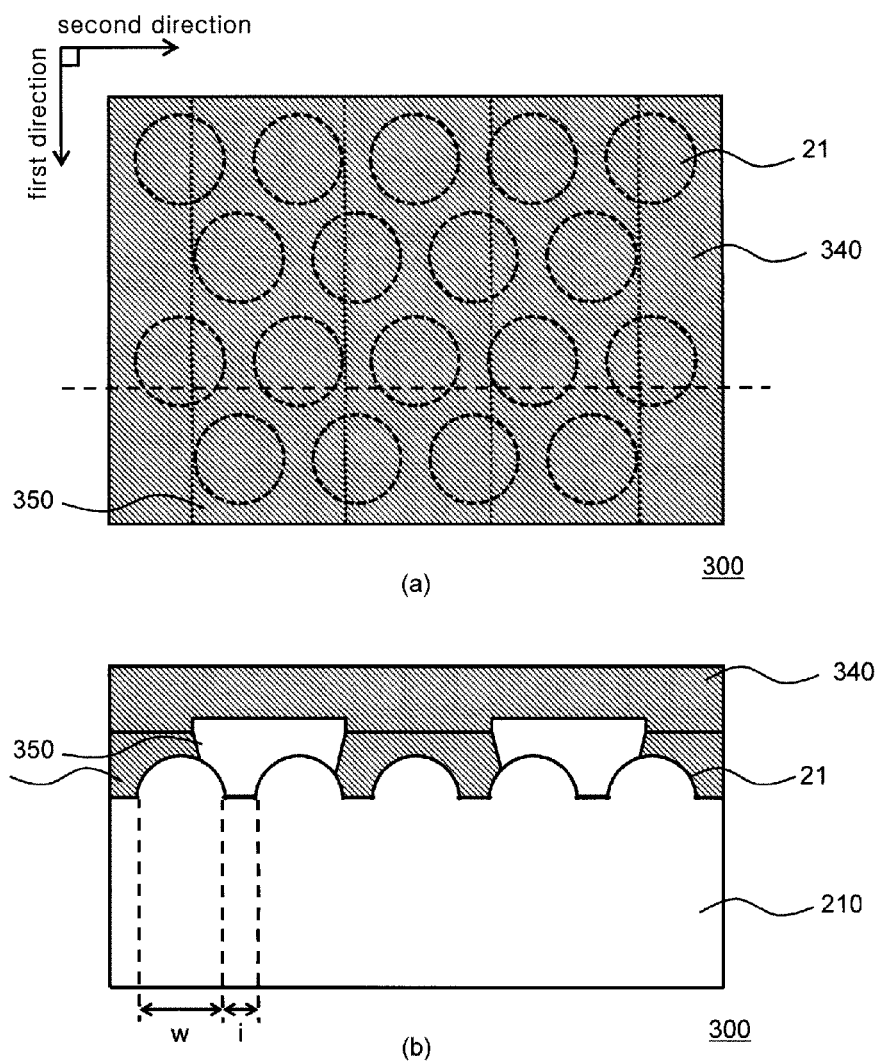

The invention is described more fully hereinafter with reference to the accompanying drawings, in which exemplary embodiments of the invention are shown. This invention may, however, be embodied in many different forms and should not be construed as limited to the exemplary embodiments set forth herein. Further, like reference numerals denote like elements through the specification and the accompanying drawings.

As described above, conventionally, it is difficult to lift-off a thin semiconductor substrate from a heterogeneous substrate when the semiconductor substrate is grown on a heterogeneous substrate. For example, when a GaN layer of about 10 um is formed on a sapphire substrate, it is difficult to lift-off the GaN layer from the sapphire substrate only through application of stress. Thus, conventionally, a GaN layer is further formed to a thickness of about 100 um thereon. The inventors of the present invention found that, when a GaN layer is formed to a thickness of about 10 um by metal organic chemical vapor deposition (MOCVD) using a PSS substrate, which is a sapphire substrate having a specific pattern, the GaN layer can be lifted-off from the PSS substrate.

A first exemplary embodiment of the invention will be described.

FIG. 1 shows a semiconductor substrate 100 according to a first exemplary embodiment of the present invention. Here, FIG. 1(a) is a plan view of the semiconductor substrate 100 and FIG. 1(b) is a partially cross-sectional view taken along a dotted line of FIG. 1(a). The semiconductor substrate 100 includes a PSS substrate 110 (hereinafter, referred to as a "substrate 110") and a first semiconductor layer 20. In this embodiment, the substrate 110 may have a different composition from the first semiconductor layer 20. Although the first semiconductor layer 20 is illustrated as being formed of GaN in this embodiment, the invention is not limited thereto and any material may be used for the first semiconductor layer so long as the material may be applicable to light emitting devices (LEDs). The c-plane of the substrate, that is, a first plane 10a of the substrate on which the first semiconductor layer 20 will be formed, has a plurality of semispherical protrusions 11 arranged at an interval (i) and each having a bottom surface width (w). Herein, the interval (i) means the shortest distance between two semispherical protrusions 11.

FIG. 2 is a diagram of a pattern of semispherical protrusions 11 according to one exemplary embodiment of the invention. When each of the semispherical protrusions 11 has a circular bottom surface having a radius of w/2, the centers of the semispherical protrusions 11 are respectively located at vertexes of an equilateral triangle, each side of which has a length of w+i. Specifically, in the pattern of semispherical protrusions 11 according to this embodiment, sets of three semispherical protrusions 11 are repeatedly arranged in a first direction and a second direction orthogonal to the first direction on the first plane 10a of the substrate 110.

On the c-plane of the substrate 110, the first semiconductor layer 20 is not easily lifted-off from the substrate 110 due to a high bonding force between the substrate 110 and the first semiconductor layer 20. However, since curved surfaces of the semispherical protrusions 11 allow the first semiconductor layer 20 to be simply seated on the substrate 110 with very low bonding force, the first semiconductor layer 20 can be easily lifted-off from the substrate 110. Thus, in this embodiment, the semispherical protrusions 11 are arranged at a predetermined interval (i) on the c-plane 10a of the substrate 110, thereby allowing the first semiconductor layer 20 to be easily lifted-off from the substrate 110. Here, for the substrate 110 according to this embodiment, the ratio of the total surface area of the semispherical protrusions 11 to the area of the c-plane of the substrate 110 may be 1 or more. The substrate 110 having such a ratio of the total surface area of the semispherical protrusions 11 to the area of the c-plane of the substrate 110 allows the first semiconductor layer 20 to be easily lifted-off from the substrate 110.

In this embodiment, the area of the c-plane of the substrate 110, the width (w) of the bottom surface of each of the semispherical protrusions 11, and the interval (i) of the semispherical protrusions 11 may be arbitrarily set to obtain the ratio described above. According to this embodiment, the bottom surface width of each of the semispherical protrusions 11 may be 5 um or less. When the bottom surface width of each of the semispherical protrusions 11 is set to 5 um or less, the first semiconductor layer 20 may be easily lifted-off from the substrate 110. Such a pattern of semispherical protrusions 11 may be formed by etching the substrate, for example, through photolithography. Photolithography is generally used for formation of a pattern, but is limited up to a line width of 1 um to ensure good quality of the pattern. Thus, when forming the pattern of semispherical protrusions 11 on the substrate 110 according to this embodiment, the interval (i) of the semispherical protrusions 11 may be set to 1 um or more. For example, on the substrate 110 shown in FIG. 1, when the interval (i) between two semispherical protrusions 11 is set to 1 um, the bottom surface width of each of the semispherical protrusions 11 is set to 3 um in order to have the ratio described above.

Next, a method of fabricating the semiconductor substrate 100 according to this embodiment will be described. FIG. 3A and FIG. 3B show sectional views illustrating the method of fabricating the semiconductor substrate 100. A matrix 10 is prepared (FIG. 3A (a)) and subjected to etching to form a pattern of semispherical protrusions 11 on the c-plane of the substrate 110 (FIG. 3A (b)). As described above, photolithography may be used when forming the pattern on the substrate 110 according to this embodiment. On the substrate 110 according to this embodiment, the semispherical protrusions 11 are arranged at a predetermined interval (i) on the c-plane 10a of the substrate 110 such that the ratio of the total surface area of the semispherical protrusions 11 to the area of the c-plane of the substrate 110 becomes 1 or more. The arrangement of this pattern facilitates separation of a first semiconductor layer 20 from the substrate 110 in a lift-off process described below.

Then, the first semiconductor layer 20 is formed on an upper surface (that is, c-plane) of the substrate 110 having the pattern of semispherical protrusions 11 (FIG. 3A (c)). The first semiconductor layer 20 may be formed by metal organic chemical vapor deposition (MOCVD). The conditions for forming the first semiconductor layer 20 may be arbitrarily set depending on the thickness of a material or layer to be used for the first semiconductor layer 20. The formation of the first semiconductor layer 20 is performed until an upper surface of the first semiconductor layer 20 (second plane opposite the first plane defined as the c-plane of the substrate 110) becomes flat. For example, when forming the pattern of semispherical protrusions 11 each having a bottom surface width of 3 um on the substrate 110 to be arranged at an interval of 1 um, the first semiconductor layer 20 can be flattened by forming the first semiconductor layer 20 to a thickness of 10 um. As a result, it is possible to manufacture a semiconductor substrate 100 according to the embodiment.

The prepared semiconductor substrate 100 allows the substrate 110 to be easily lifted-off therefrom. Then, a second substrate 170 is attached to an upper surface of the first semiconductor layer 20 of the semiconductor substrate 100 via a bonding layer 180 (FIG. 3B (d)). The second substrate 170 may be formed of, for example, silicon (Si) substrate, silicon carbide (SiC), or metal. Further, the bonding layer 180 may be formed of, for example, gallium (Ga), indium (In), aluminum (Al), gold (Au), an alloy of gold and tin (Sn), or adhesives known in the art.

Then, the substrate 110 is lifted-off from the semiconductor substrate 100, to which the second substrate 170 is bonded (FIG. 3B (e)). Separation of the first semiconductor layer 20 from the substrate 110 may be performed by, for example, a laser lift-off process. In a fabricated semiconductor substrate 101, the first semiconductor layer 20 has concavities at portions adjoining the semispherical protrusions 11. When a semiconductor device such as an LED is manufactured using the semiconductor substrate 101 that has the first semiconductor layer 20 having such concavities formed therein, the semiconductor device exhibits about two times higher light extraction efficiency than semiconductor devices known in the art.

Further, in the semiconductor substrate 101, the first semiconductor layer 20 may be flattened by a polishing process (FIG. 3B (f)). In this embodiment, the first semiconductor layer 20 may be lifted-off from the substrate 110 using mechanical lift-off instead of laser lift-off. Consequently, it is possible to obtain a flat and thin semiconductor substrate 105.

As such, according to this embodiment, the first semiconductor layer is formed on the substrate having a plurality of semispherical protrusions arranged at a predetermined interval on the first plane thereof, so that it is possible to fabricate a thin and flat semiconductor substrate which can be easily lifted-off from the substrate.

Next, a second exemplary embodiment of the invention will be described.

In the first exemplary embodiment, the first semiconductor layer is formed on the substrate having the semispherical protrusions. In the second exemplary embodiment, a metallic material layer having a pattern of predetermined shapes is formed on an upper surface of the first semiconductor layer (on a second plane opposite the first plane of the substrate 110, that is, the c-plane of the substrate 110), followed by forming a second semiconductor layer on the metallic material layer using MOCVD to form cavities in the first semiconductor layer. In the semiconductor substrate according to this embodiment, when the first semiconductor layer is thinly formed to be less than 10 um on a substrate, it is possible to easily lift-off the first semiconductor layer from the substrate.

FIG. 4 shows a semiconductor substrate 200 according to the second exemplary embodiment of the invention, in which FIG. 4 (a) is a plan view of the semiconductor substrate 200 and FIG. 4(b) is a sectional view taken along a dotted line of FIG. 4 (a). The semiconductor substrate 200 includes a substrate 210, a first semiconductor layer 220, a second semiconductor layer 240 and cavities 250. In this embodiment, the substrate 210 may have a different composition from the first semiconductor layer 220. Although the first semiconductor layer 220 is illustrated as being formed of GaN in this embodiment, the invention is not limited thereto and any material may be used for the first semiconductor layer so long as the material may be applicable to LEDs. Further, the second semiconductor layer 240 may have the same or different composition from the first semiconductor layer 220. As in the semiconductor substrate 100, the c-plane of the substrate 210 for the semiconductor substrate 200, that is, the first plane of the substrate 210 on which the first semiconductor layer 220 will be formed, has a plurality of semispherical protrusions 21 arranged at an interval (i) and each having a bottom surface width (w).

The cavities 250 are formed to surround the semispherical protrusions 21 of the first semiconductor layer 220 and the second semiconductor layer 240. In this embodiment, the cavities 250 are formed at positions corresponding to the interval (i) between two semispherical protrusions 21. As shown in FIG. 4(a), the cavities 250 are arranged such that the centers of the cavities are respectively located at vertexes of a hexagonal shape, the center of which is coincident with the center of the semispherical protrusion 21 and which is disposed to fill the first plane of the substrate 210, that is, the c-plane of the substrate 210, like a cross-section of a honeycomb structure. The other configurations of the semiconductor substrate 200 are the same as those of the semiconductor substrate 100, and detailed descriptions thereof will be omitted herein.

Next, a method of fabricating the semiconductor substrate 200 according to this embodiment will be described. FIG. 5A and FIG. 5B show sectional views illustrating the method of fabricating the semiconductor substrate 200. The processes shown in FIG. 5A (a) to (c) are the same as those of the semiconductor substrate 100, and detailed descriptions thereof will be omitted herein. A metallic material layer 230 having a pattern of predetermined shapes is formed on an upper surface of the first semiconductor layer 220 (FIG. 5A (d)). The metallic material layer 230 is composed of cylindrical metal islands each having a width (a bottom surface width thereof), which is the same as the predetermined interval (i). The metallic material layer 230 may be formed of metal which reacts with components used for the first semiconductor layer 220. For example, when the first semiconductor layer 220 is formed of GaN, tantalum, titanium or chromium may be suitably used for the metallic material layer 230. The metallic material layer 230 may be formed using an electron beam (EB) deposition or lift-off process. Then, in the metallic material layer 230, the cylindrical metal islands each having a width (the bottom surface width) which is the same as the predetermined interval (i), are formed at positions corresponding to the interval between the semispherical protrusions 21 to surround the semispherical protrusions 21. Further, in the metallic material layer 230, the metal islands are disposed such that the centers of the metal islands are respectively located at vertexes of a hexagonal shape.

Next, a second semiconductor layer 240 is formed. The second semiconductor layer 240 is formed by MOCVD. The conditions for forming the second semiconductor layer 240 may be arbitrarily set depending on the thickness of a material or layer to be used for the second semiconductor layer 240. When the second semiconductor layer 240 is formed, the metallic material layer 230 reacts with a component constituting the first semiconductor layer 220, so that some of the first semiconductor layer 220 adjoining the bottom surface of the metallic material layer 230 is decomposed, forming cavities 250 (FIG. 5A (e)). For example, if the first semiconductor layer 220 is formed of GaN and the metallic material layer 230 is formed of tantalum, nitrogen in the first semiconductor layer 220 reacts with tantalum to form tantalum nitride (TaN), so that GaN of the first semiconductor layer 220 is decomposed, whereby the cavities 250 are formed on part of the first semiconductor layer 220 adjoining the bottom surface of the metallic material layer 230. Here, the second semiconductor layer 240 is formed on an upper surface of the first semiconductor layer 220 and a lateral surface of the metallic material layer 230.

After the cavities 250 are formed, the metallic material layer 230 is removed. If the metallic material layer 230 is formed of, for example, Ta, removal of the metallic material layer may be achieved by etching using hydrogen fluoride (HF). For example, removal of the metallic material layer may be achieved by immersing the semiconductor substrate having the cavities 250 in a 50% HF aqueous solution. For example, the semiconductor substrate may be immersed in the solution for 25 hours. Although this embodiment is illustrated as using HF for etching, any solution may be used to etch the metallic material layer 230 so long as the solution is capable of dissolving the metallic material layer without dissolving the first semiconductor layer 220 and the second semiconductor layer 240. After removing the metallic material layer 230, the second semiconductor layer 240 is further grown to fabricate the semiconductor substrate 200 according to this embodiment (FIG. 5B (f)).

The prepared semiconductor substrate 200 allows the substrate 210 to be easily lifted-off therefrom. Then, a second substrate 170 is attached to an upper surface of the first semiconductor layer 220 of the semiconductor substrate 200 via a bonding layer 180 (FIG. 5B (d)). The second substrate 170 and the bonding layer 180 in this embodiment are the same as those of the first exemplary embodiment, and detailed descriptions thereof will be omitted herein. The semiconductor substrate 200 may be easily lifted-off from the semispherical protrusions 21 and is torn near the bottom surfaces of the cavities 250, thereby allowing the substrate 210 to be easily lifted-off therefrom (FIG. 5B (h)). To lift-off the first semiconductor layer 220 and the second semiconductor layer 240 from the substrate 210, for example, a laser lift-off process may be used. In a prepared semiconductor substrate 201, the first semiconductor layer 220 has concavities at portions adjoining the semispherical protrusions 21. When a semiconductor device such as an LED is manufactured using the semiconductor substrate 201 that has the first semiconductor layer 220 having such concavities formed therein, the semiconductor device exhibits about two times higher light extraction efficiency than semiconductor devices known in the art.

Further, in the semiconductor substrate 201, the first semiconductor layer 220 may be flattened by a polishing process (FIG. 5B (i)). In this embodiment, the first semiconductor layer 20 may be lifted-off from the substrate 210 using mechanical lift-off instead of laser lift-off. Consequently, it is possible to obtain a flat and thin semiconductor substrate 205.

In this embodiment, when the first semiconductor layer is formed to a small thickness of less than 10 um, semispherical protrusions 21 each having a bottom surface width of 1 um are formed, for example, on the substrate 210 shown in FIG. 4. After the first semiconductor layer 220 is grown to a thickness of 2 um, a metallic material layer 230 is formed by forming metal islands each having a width of 1 um on the first semiconductor layer 220, and a second semiconductor layer 240 is grown to a thickness of 3 um thereon, thereby forming a semiconductor substrate 200 having a flat surface.

As described above, according to this embodiment, the first semiconductor layer is formed on the substrate having a plurality of semispherical protrusions arranged at a predetermined interval on the first plane, the metallic material layer having a pattern of predetermined shapes is formed on the second plane of the first semiconductor layer, and the second semiconductor layer is formed on the second plane, so that the cavities are formed in the first semiconductor layer adjoining the metallic material layer. As a result, it is possible to provide a flat and thin semiconductor substrate which can be easily lifted-off from the substrate through the semispherical protrusions formed on the substrate and the cavities formed in the first semiconductor layer. According to this embodiment, when the first semiconductor layer is thinly formed to a thickness of less than 10 um, the first semiconductor layer can be easily lifted-off from the substrate.

Next, a third exemplary embodiment of the invention will be described.

In the second exemplary embodiment, the cavities are formed by positioning the cylindrical metal islands at positions corresponding to the interval between the semispherical protrusions to surround the semispherical protrusions. In the third exemplary embodiment, a metallic material layer is formed in a pattern of predetermined shapes that is composed of a plurality of rectangles each having a long side disposed in a first direction and arranged in a second direction orthogonal to the first direction. In the semiconductor substrate according to this embodiment, when a first semiconductor layer is thinly formed to be less than 10 um on a substrate, it is possible to easily lift-off the first semiconductor layer from the substrate.

FIG. 6 shows a semiconductor substrate 300 according to the third exemplary embodiment of the invention. Here, FIG. 6(a) is a plan view of the semiconductor substrate 300 and FIG. 6(b) is a sectional view taken along a dotted line of FIG. 6(a). The semiconductor substrate 300 includes a substrate 210, a first semiconductor layer 320, a second semiconductor layer 340, and cavities 350. In this embodiment, the substrate 210 may have a different composition from the first semiconductor layer 320. Although the first semiconductor layer 320 is illustrated as being formed of GaN in this embodiment, the invention is not limited thereto and any material may be used for the first semiconductor layer so long as the material is applicable to LEDs. Further, the second semiconductor layer 340 has the same or different composition from the first semiconductor layer 320. As in the semiconductor substrate 100, the c-plane of the substrate 210 for the semiconductor substrate 300, that is, a first plane of the substrate 210 on which the first semiconductor layer 320 will be formed, has a plurality of semispherical protrusions 21 arranged at an interval (i) and each having a bottom surface width (w).

The first semiconductor layer 320 and the second semiconductor layer 340 have a plurality of cavities 350, which have a rectangular shape with a long side disposed in a first direction and are arranged in a second direction orthogonal to the first direction. The other configurations of the semiconductor substrate 300 are the same as those of the semiconductor substrate 100 or 200, and detailed descriptions thereof will be omitted herein.

Next, a method of fabricating the semiconductor substrate 300 according to this embodiment will be described. FIG. 7A and FIG. 7B show sectional views illustrating the method of fabricating the semiconductor substrate 300. The processes shown in FIG. 7A (a) to (c) are the same as those of the semiconductor substrate 100, and detailed descriptions thereof will be omitted herein. A metallic material layer 330 having a pattern of predetermined shapes is formed on an upper surface of the first semiconductor layer 320 (FIG. 7A (d)). The metallic material layer 330 may be formed using an electron beam (EB) deposition or lift-off process. In this embodiment, the metallic material layer 330 is formed by placing a plurality of rectangular metal stripes each having a long side disposed in a {1-100} direction of the first semiconductor layer 320 or in an equivalent direction to the {1-100} direction on the first semiconductor layer 320 to be arranged in a direction orthogonal to the {1-100} direction or to the equivalent direction to the {1-100} direction or to be arranged in an equivalent direction to this direction. For example, when forming a pattern of semispherical protrusions 21 arranged at an interval (i) of 1 um, and a bottom surface width (w) of 3 um on the substrate 210, rectangular metal stripes having a thickness of about 50 um and a width of 5 um are arranged at an interval of 5 um, thereby forming the metallic material layer. Here, the metallic material may be tantalum (Ta). In addition, the thickness of the metallic material layer 330 may vary depending on the kind of metallic material for the metallic material layer and may be as high as possible.

Next, a second semiconductor layer 340 is formed on the metallic material layer using MOCVD. The conditions for forming the second semiconductor layer 340 may be arbitrarily set depending on the thickness of a material or layer to be used for the second semiconductor layer 340. When the second semiconductor layer 340 is formed, the metallic material layer 330 reacts with a component constituting the first semiconductor layer 320, so that some of the first semiconductor layer 320 adjoining the bottom surface of the metallic material layer 330 is decomposed, forming cavities 350 (FIG. 7A (e)).

In this embodiment, when the metallic material layer 330 is formed to have a long side disposed in the {1-100} direction of the first semiconductor layer 320 or in an equivalent direction to the {1-100}, reaction between components constituting the first semiconductor layer 320 and the metallic material layer 330 is facilitated, and decomposition of portions of the first semiconductor layer 320 adjoining the bottom surface of the metallic material layer 330 is also facilitated. This is because a growth rate in a direction parallel to the substrate is higher than the growth rate in a second direction of the metallic material layer 330. Thus, advantageously, the cavities 350 are efficiently formed in the first semiconductor layer 320. The material for the metallic material layer 330 in this embodiment is the same as that for the metallic material layer 230, and a detailed description thereof will be omitted herein.

After the cavities 350 are formed, the metallic material layer 330 is removed. Since removal of the metallic material layer may be achieved by the same process as in the second embodiment, a detailed description thereof will be omitted.

After removing the metallic material layer 330, the second semiconductor layer 340 is further grown to fabricate the semiconductor substrate 200 according to this embodiment (FIG. 7B (f)).

The prepared semiconductor substrate 300 allows the substrate 210 to be easily lifted-off therefrom. Then, a second substrate 170 is attached to an upper surface of the second semiconductor layer 340 of the semiconductor substrate 300 via a bonding layer 180 (FIG. 7B (d)). The second substrate 170 and the bonding layer 180 are the same as those of the first exemplary embodiment, and a detailed description thereof will be omitted herein. The semiconductor substrate 300 may be easily lifted-off from the semispherical protrusions 21 and is torn near the bottom surfaces of the cavities 350, thereby allowing the substrate 210 to be easily lifted-off therefrom (FIG. 7B (h)). To lift-off the first semiconductor layer 320 and the second semiconductor layer 340 from the substrate 210, for example, a laser lift-off process may be used. In a prepared semiconductor substrate 301, the first semiconductor layer 320 has concavities at portions adjoining the semispherical protrusions 21. When a semiconductor device such as an LED is manufactured using the semiconductor substrate 301 that has the first semiconductor layer 320 having such concavities formed therein, the semiconductor device exhibits about two times higher light extraction efficiency than semiconductor devices known in the art.

Further, in the semiconductor substrate 301, the first semiconductor layer 320 may be flattened by a mechanical lift-off process (FIG. 7B (i)). In this embodiment, the first semiconductor layer 220 may be lifted-off from the substrate 210 using mechanical lift-off instead of laser lift-off. Consequently, it is possible to obtain a flat and thin semiconductor substrate 305.

In this embodiment, when the first semiconductor layer is formed to a small thickness of less than 10 um, semispherical protrusions 21 each having a bottom surface width of 1 um are formed, for example, on the substrate 210 shown in FIG. 6. After the first semiconductor layer 320 is grown to a thickness of 2 um, a metallic material layer 330 is formed by placing a plurality of rectangular metal stripes each having a long side disposed in a {1-100} direction of the first semiconductor layer or in an equivalent direction to the {1-100} direction to be arranged in a second direction orthogonal to the first direction, and a second semiconductor layer is formed on a second plane, so that the cavities are formed at portions of the first semiconductor layer adjoining the metallic material layer. As a result, it is possible to provide a flat and thin semiconductor substrate which can be easily lifted-off from the substrate through the semispherical protrusions formed on the substrate and the cavities formed in the first semiconductor layer. According to this embodiment, when the first semiconductor layer is thinly formed to a thickness less than 10 um, the first semiconductor layer can be easily lifted-off from the substrate.

Next, a fourth exemplary embodiment of the invention will be described.

In the first to third exemplary embodiment, the first semiconductor layer is formed on the substrate having the semispherical protrusions. In the fourth exemplary embodiment, the first semiconductor layer is formed on a substrate having a plurality of curved concavities arranged at a predetermined interval on a first plane of the substrate.

FIG. 8 shows a semiconductor substrate 400 according to the fourth exemplary embodiment of the invention. FIG. 8(a) is a plan view of the semiconductor substrate 400 and FIG. 8(b) is a sectional view taken along a dotted line of FIG. 8(a).

The semiconductor substrate 400 includes a PSS substrate 410 (hereinafter, referred to as a "substrate 410") and a first semiconductor layer 420. In this embodiment, the substrate 410 may have a different composition from the first semiconductor layer 420. Although the first semiconductor layer 420 illustrated as being formed of GaN in this embodiment, the invention is not limited thereto and any material may be used for the first semiconductor layer so long as the material is applicable to LEDs. The c-plane of the substrate 410, that is, the first plane 10a of the substrate 410 on which the first semiconductor layer 420 will be formed, has a plurality of curved concavities 460 arranged at a predetermined interval (i). Herein, the interval (i) means the shortest distance between two curved concavities 460. In this embodiment, as the pattern of curved concavities is formed at a predetermined interval on the c-plane of the substrate 410, that is, on the first plane of the substrate, the first semiconductor layer 420 may be easily lifted-off from the substrate 410.

On the c-plane of the substrate 410, the first semiconductor layer 420 is not easily lifted-off from the substrate 410 due to a high bonding force between the substrate 410 and the first semiconductor layer 420. However, since the curved concavities 460 allow the first semiconductor layer 420 to be simply seated on the substrate 410 with very low bonding force, the first semiconductor layer 420 can be easily lifted-off from the substrate 410. Thus, in this embodiment, the curved concavities 460 are arranged at a predetermined interval (i) on the c-plane 10a of the substrate 410, thereby allowing the first semiconductor layer 420 to be easily lifted-off from the substrate 410. Although the curved concavities 460 are illustrated as having a semispherical shape in FIG. 8, it is necessary for the curved concavities 460 to have a flat bottom surface. Further, the curved concavities 460 may have any suitable shape. For example, the curved concavities 460 may have a mortar shape or a conical shape.

For example, if the curved concavities 460 are semispherical concavities as shown in FIG. 8, the ratio of the total surface area of the curved concavities 460 to the area of the c-plane of the substrate 410 may be 1 or more. The substrate 40 having such a ratio of the total surface area of the curved concavities 460 to the area of the c-plane of the substrate 410 allows the first semiconductor layer 420 to be easily lifted-off from the substrate 410. When each of the curved concavities 460 has a circular bottom surface having a radius of w/2, the centers of the curved concavities 460 are respectively located at vertexes of an equilateral triangle, each side of which has a length of w+i. Specifically, in the pattern of curved concavities 460 according to this embodiment, sets of three curved concavities 460 are repeatedly arranged in a first direction and a second direction orthogonal to the first direction on the first plane 10a of the substrate 410.

In this embodiment, the area of the c-plane of the substrate 410, the width (w) of the bottom surface of each of the curved concavities 460, and the interval (i) of the curved concavities 460 may be arbitrarily set to obtain the ratio described above.

According to this embodiment, the bottom surface width of each of the curved concavities 460 may be 5 um or less. When the bottom surface width of each of the curved concavities 460 is set to 5 um or less, the first semiconductor layer 420 may be easily lifted-off from the substrate 410. Such a pattern of curved concavities 460 may be formed by etching a matrix 10, for example, through photolithography. Photolithography is generally used for formation of a pattern, but is limited up to a line width of 1 um to ensure good pattern quality. Thus, when forming the pattern of curved concavities 460 according to this embodiment on the substrate 410, the interval (i) of the curved concavities 460 may be set to 1 um or more. For example, on the substrate 410 shown in FIG. 8, when the interval (i) between two curved concavities 460 is set to 1 um, the bottom surface width of each of the curved concavities 460 is set to 3 um in order to obtain the ratio described above.

Next, a method of fabricating the semiconductor substrate 400 according to this embodiment will be described. FIG. 9A and FIG. 9B show sectional views illustrating the method of fabricating the semiconductor substrate 400. A matrix 10 is prepared (FIG. 9A (a)) and subjected to etching to form a pattern of curved concavities 460 on the c-plane of the substrate 410 (FIG. 9A (b)). As described above, photolithography may be used when forming the pattern on the substrate 410 according to this embodiment. On the substrate 410 according to this embodiment, the curved concavities 460 are arranged at a predetermined interval (i) on the c-plane 10a of the substrate 410 such that the ratio of the total surface area of the curved concavities 460 to the area of the c-plane of the substrate 410 becomes 1 or more. The arrangement of this pattern facilitates separation of a first semiconductor layer 420 from the substrate 410 in a lift-off process described below.

Then, the first semiconductor layer 420 is formed on an upper surface (that is, c-plane) of the substrate 410 having the pattern of curved concavities 460 (FIG. 9A (c)). The first semiconductor layer 420 may be formed by MOCVD. The conditions for forming the first semiconductor layer 420 may be arbitrarily set depending on the thickness of a material or layer to be used for the first semiconductor layer 420. The formation of the first semiconductor layer 420 is performed until an upper surface of the first semiconductor layer 420 (second plane opposite the first plane defined as the c-plane of the substrate 410) becomes flat. For example, when forming the pattern of curved concavities 460 each having a bottom surface width of 3 um on the substrate 410 to be arranged at an interval of 1 um, the first semiconductor layer 420 can be flattened by forming the first semiconductor layer 20 to a thickness of 410 um. As a result, it is possible to manufacture a semiconductor substrate 400 according to the embodiment.

The prepared semiconductor substrate 400 allows the substrate 410 to be easily lifted-off therefrom. Then, a second substrate 170 is attached to an upper surface of the first semiconductor layer 420 of the semiconductor substrate 400 via a bonding layer 180 (FIG. 9B (d)). The second substrate 170 and the bonding layer 180 in this embodiment are the same as those of the first exemplary embodiment, and detailed descriptions thereof will be omitted herein. The prepared semiconductor substrate 400 allows the substrate 410 to be easily lifted-off therefrom (FIG. 9B (e)). Separation of the first semiconductor layer 420 from the substrate 410 may be performed by, for example, a laser lift-off process. In a fabricated semiconductor substrate 401, the first semiconductor layer 420 has protrusions at portions adjoining the curved concavities 460. When a semiconductor device such as an LED is manufactured using the semiconductor substrate 401 that has the first semiconductor layer 420 having such protrusions formed thereon, the semiconductor device exhibits about two times higher light extraction efficiency than semiconductor devices known in the art.

Further, the semiconductor substrate 401 may be flattened by a polishing process (FIG. 9B (f)). In this embodiment, the first semiconductor layer 420 may be lifted-off from the substrate 410 using mechanical lift-off instead of laser lift-off. Consequently, it is possible to obtain a flat and thin semiconductor substrate 405.

As such, according to the present embodiment, the first semiconductor layer is formed on the substrate having a plurality of curved concavities arranged at a predetermined interval on the first plane thereof, so that it is possible to fabricate a thin and flat semiconductor substrate which can be easily lifted-off from the substrate.

Next, a fifth exemplary embodiment of the invention will be described.

In the fourth exemplary embodiment, the first semiconductor layer is formed on the substrate having a plurality of curved concavities. On the contrary, in the fifth embodiment of the invention, the first semiconductor layer is formed on a substrate having a plurality of troughs arranged at a predetermined interval on a first plane of the substrate.

FIG. 10 shows a semiconductor substrate 500 according to the fifth exemplary embodiment of the invention. FIG. 10(a) is a plan view of the semiconductor substrate 500 and FIG. 10(b) is a sectional view taken along a dotted line of FIG. 10(a). The semiconductor substrate 500 includes a PSS substrate 510 (hereinafter, referred to as a "substrate 510") and a first semiconductor layer 520. In this embodiment, the substrate 510 may have a different composition from the first semiconductor layer 520. Although the first semiconductor layer 520 is illustrated as being formed of GaN in this embodiment, the invention is not limited thereto and any material may be used for the first semiconductor layer so long as the material may be applicable to LEDs. The c-plane of the substrate 510, that is, the first plane 10a of the substrate 510 on which the first semiconductor layer 520 will be formed, has a plurality of troughs 560 arranged at a predetermined interval (i). In this embodiment, as the pattern of troughs is formed at a predetermined interval on the c-plane of the substrate 510, that is, on the first plane of the substrate 510, the first semiconductor layer 520 may be easily lifted-off from the substrate 510.

In this embodiment, the troughs 560 are formed to have a sufficiently narrow width (w) to prevent the first semiconductor layer 520 from being grown on the bottom surfaces (that is, c-plane) of the troughs 560. Further, as shown in FIG. 10, according to this embodiment, cavities 555 are formed at upper portions of the troughs 560 to extend towards a second plane opposite the first plane of the first semiconductor layer 520 adjoining the c-plane of the substrate 510. The extended portion of the cavity 520 is formed by gradually growing the first semiconductor layer, which is grown on the c-plane of the substrate 510, in a direction parallel to the c-plane.

According to this embodiment, the bottom surface width (w) of each of the troughs 560 may be 5 um or less. When the bottom surface width (w) of the trough 560 is set to 5 um or less, the troughs 560 prevent the first semiconductor layer 520 from growing on the bottom surfaces thereof while allowing the cavities to be grown thereon, thereby facilitating separation of the first semiconductor layer 520 from the substrate 510. If the bottom surface width (w) of the troughs 560 is greater than 5 um, the first semiconductor layer 520 is grown on the bottom surfaces of the troughs 560, making it difficult to lift-off the first semiconductor layer 520 from the substrate 510. Further, such a pattern of troughs 560 may be formed by etching the matrix 10, for example, through photolithography. Photolithography is generally used for formation of a pattern, but is limited up to a line width of 1 um to ensure good pattern quality. Thus, when forming the pattern of troughs 560 according to this embodiment on the substrate 510, the width (w) of the troughs 560 may be set to 1 um or more.

Next, a method of fabricating the semiconductor substrate 500 according to this embodiment will be described. FIG. 11A and FIG. 1B show sectional views illustrating the method of fabricating the semiconductor substrate 500. A matrix 10 is prepared (FIG. 11A(a)) and subjected to etching to form a pattern of troughs 560 on the c-plane of the substrate 510 (FIG. 11A(b)). As described above, photolithography may be used when forming the pattern on the substrate 510 according to this embodiment. According to this embodiment, the troughs 560 may have a width (w) of 5 um or less. When MOCVD is performed at 500 Torr or more, the width (w) of the troughs may be set to 2 um or less. The arrangement of this pattern facilitates separation of a first semiconductor layer 520 from the substrate 510 in a lift-off process described below.

Then, the first semiconductor layer 520 is formed on an upper surface (that is, c-plane) of the substrate 510 having the pattern of troughs 560 (FIG. 11A(c)). The first semiconductor layer 520 may be formed by MOCVD. The conditions for forming the first semiconductor layer 520 may be arbitrarily set depending on the thickness of a material or layer to be used for the first semiconductor layer 520. The formation of the first semiconductor layer 520 is performed until an upper surface of the first semiconductor layer 520 (second plane opposite the first plane defined as the c-plane of the substrate 510) becomes flat. As a result, it is possible to manufacture a semiconductor substrate 500 according to the embodiment.

The prepared semiconductor substrate 500 allows the substrate 510 to be easily lifted-off therefrom. Then, a second substrate 170 is attached to an upper surface of the first semiconductor layer 520 of the semiconductor substrate 500 via a bonding layer 180 (FIG. 11B (d)). The second substrate 170 and the bonding layer 180 in this embodiment are the same as those of the first exemplary embodiment, and detailed descriptions thereof will be omitted herein. The prepared semiconductor substrate 500 allows the substrate 510 to be easily lifted-off therefrom (FIG. 11B (e)). Separation of the first semiconductor layer 520 from the substrate 510 may be performed by, for example, a laser lift-off process. In a fabricated semiconductor substrate 501, the first semiconductor layer 520 has concavities at portions adjoining the troughs 560. When a semiconductor device such as an LED is manufactured using the semiconductor substrate 501 that has the first semiconductor layer 420 having such concavities formed therein, the semiconductor device exhibits about two times higher light extraction efficiency than semiconductor devices known in the art.

Further, the semiconductor substrate 501 may be flattened by a polishing process (FIG. 11B (f)). In this embodiment, the first semiconductor layer 520 may be lifted-off from the substrate 510 using mechanical lift-off instead of laser lift-off. Consequently, it is possible to obtain a flat and thin semiconductor substrate 505.

As such, according to the present embodiment, the first semiconductor layer is formed on the substrate having a plurality of troughs 560 having a predetermined width on the first plane thereof, so that it is possible to fabricate a thin and flat semiconductor substrate which can be easily lifted-off from the substrate.

Next, a semiconductor device according one exemplary embodiment of the invention will be described.

A semiconductor device, such as an LED, may be fabricated using one of the semiconductor substrates 100 to 500 according to the embodiments of the invention described above. Herein, a semiconductor device 1000 fabricated using the semiconductor substrate 105 will be described as one example. FIG. 12 is a sectional view of the semiconductor device 1000 according to one exemplary embodiment of the invention. The semiconductor device 1000 includes an ohmic contact layer 1110 on a surface of the first semiconductor layer 20 of the semiconductor substrate 105 and an ohmic contact layer 1130 on a surface of a second substrate.

The ohmic contact layer 1110 may be formed by stacking, for example, a 10 nm Ti layer, a 10 nm Al layer, and a 10 um Al layer. Further, the ohmic contact layer 1130 may be formed by stacking, for example, a 50 nm Au layer and a 50 nm Sb layer when the second substrate 170 is a Si substrate. A bonding layer 180 may be, for example, a 3 um Au layer. Here, although not shown in the drawings, an ohmic contact layer composed of a 10 nm Au layer and a 10 nm nickel layer is formed between the first semiconductor layer 20 and the bonding layer 180. An N-type semiconductor is provided to the ohmic contact layer 1110 side of the first semiconductor layer 20, and a P-type semiconductor is provided to the bonding layer 180 side of the first semiconductor layer 20.

Further, an active layer may be located between the N-type semiconductor and the P-type semiconductor. The N-type semiconductor, the active layer and the P-type semiconductor may be formed before attaching the second substrate.

As such, when fabricating the semiconductor device 1000 using the semiconductor substrate 105, it is possible to reduce manufacturing costs of the LED. Further, although the semiconductor device 1000 is illustrated as being formed on the semiconductor substrate 105 prepared from the semiconductor substrate 100 in this embodiment, the semiconductor device 1000 may be suitably formed using any one selected from the semiconductor substrates 200~500, a substrate lifted-off therefrom, a flattened substrate, and the like.

On the other hand, it is possible to fabricate the semiconductor device using the first semiconductor layer as a growth substrate after lifting-off the first semiconductor layer 20 or the second semiconductor layer 240 from the semiconductor substrate.

FIG. 13 is a sectional view of a semiconductor device 2000 according to another exemplary embodiment of the invention. The first semiconductor layer 20 is a semiconductor layer lifted-off from the semiconductor substrate 100. The semiconductor device 2000 includes a first compound semiconductor layer 930, an active layer 950 and a second compound semiconductor layer 970 on an upper surface of the first semiconductor layer 20. One ohmic contact layer is formed under the first semiconductor layer 20, and another ohmic contact layer is formed on the second compound semiconductor layer 970. Here, the first compound semiconductor layer 930 and the first semiconductor layer 20 may be the same conductive type semiconductor layers.

The semiconductor device 2000 may be fabricated by lifting off the first semiconductor layer 20 from the semiconductor substrate 100 and sequentially forming the first compound semiconductor layer 930, the active layer 950, and the second compound semiconductor layer 970 on the first semiconductor layer 20.

Here, although the semiconductor device 2000 of this embodiment is illustrated as being formed by sequentially forming the first compound semiconductor layer, the active layer and second compound semiconductor layer on the first semiconductor layer 20 lifted-off from the semiconductor substrate 100, the semiconductor device 2000 may be formed by sequentially forming the first compound semiconductor layer, the active layer and the second compound semiconductor layer on the first semiconductor layer 420 or 520, which is lifted-off from the semiconductor substrate 400 or 500. Alternatively, the semiconductor device 2000 may be formed by sequentially forming the first compound semiconductor layer, the active layer and the second compound semiconductor layer on the second semiconductor layer 240 or 340, which is lifted-off from the semiconductor substrate 200 or 300.

Although the invention has been illustrated with reference to some exemplary embodiments in conjunction with the drawings, it will be apparent to those skilled in the art that various modifications and changes can be made to the invention without departing from the spirit and scope of the invention. Therefore, it should be understood that the exemplary embodiments are provided by way of illustration only and are given to provide complete disclosure of the invention and to provide thorough understanding of the invention to those skilled in the art. Thus, it is intended that the invention covers the modifications and variations provided they fall within the scope of the appended claims and their equivalents.

The invention claimed is:

1. A method of fabricating a semiconductor substrate, the method comprising:
   forming a plurality of semispherical protrusions at an interval on a first plane of a substrate;
   forming a first semiconductor layer on the first plane of the substrate;
   forming a metallic material layer comprising a pattern of shapes on a first surface of the first semiconductor layer opposite to the first plane of the substrate; and
   forming a second semiconductor layer on the first surface of the first semiconductor layer using metal organic chemical vapor deposition to form cavities in portions of the first semiconductor layer adjoining the metallic material layer.

2. The method of claim 1, wherein forming the plurality of semispherical protrusions comprises etching the first plane of the substrate.

3. The method of claim 2, wherein the semispherical protrusions are formed on the first plane of the substrate such that the ratio of the total surface area of the plurality of semispherical protrusions to the surface area of the first plane is at least 1.

4. The method of claim 3, wherein the semispherical protrusions are formed to have a bottom surface width of 5 μm or less.

5. The method of claim 4, wherein the first semiconductor layer is formed by metal organic chemical vapor deposition.

6. The method of claim 5, wherein the substrate comprises sapphire and the first semiconductor layer comprises gallium nitride.

7. The method of claim 1, further comprising lifting-off the first semiconductor layer from the substrate.

8. The method of claim 7, wherein the first semiconductor layer is lifted-off from the substrate using a laser lift-off process.

9. The method of claim 7, wherein the first semiconductor layer is lifted-off from the substrate using a mechanical lift-off process.

10. The method of claim 1, wherein the metallic material layer is selected from the group consisting of tantalum, titanium, and chromium.

11. The method of claim 10, wherein each shape in the metallic material layer is formed to have a width equal to the interval between the semispherical protrusions at positions on the first surface of the first semiconductor layer between the semispherical protrusions.

12. The method of claim 10, wherein the pattern of shapes comprises a plurality of rectangles each having a long side disposed in a first direction, and the pattern of shapes are spaced apart from each other in a second direction orthogonal to the first direction.

13. The method of claim 12, wherein the first direction is a {1-100} direction of the first semiconductor layer or an equivalent direction to the {1-100} direction.

14. The method of claim 1, further comprising:
lifting-off the substrate using the cavities formed in the first semiconductor layer to fabricate a semiconductor substrate comprising the first semiconductor layer and the second semiconductor layer.

15. The method of claim 1, further comprising:
lifting-off the substrate from the first semiconductor layer;
forming a first compound semiconductor layer on the first semiconductor layer;
forming an active layer on the first compound semiconductor layer; and
forming a second compound semiconductor layer on the active layer.

* * * * *